United States Patent [19]
Kawakubo

[11] Patent Number: 6,100,987
[45] Date of Patent: *Aug. 8, 2000

[54] POSITION DETECTING APPARATUS

[75] Inventor: Masaharu Kawakubo, Kanagawa-ken, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/869,220

[22] Filed: Jun. 4, 1997

Related U.S. Application Data

[63] Continuation of application No. 08/409,095, Mar. 23, 1995, abandoned.

[30] Foreign Application Priority Data

Mar. 25, 1994 [JP] Japan .................................. 6-056324

[51] Int. Cl.⁷ .................................................. G01N 11/00
[52] U.S. Cl. ........................... 356/401; 356/400; 250/548
[58] Field of Search .................................. 356/399, 400, 356/401, 363; 250/548

[56] References Cited

U.S. PATENT DOCUMENTS

| | | | |
|---|---|---|---|
| 5,114,236 | 5/1992 | Matsugu et al. | 356/401 |
| 5,150,173 | 9/1992 | Isobe et al. | 356/401 |
| 5,204,535 | 4/1993 | Mizutani | 356/401 |
| 5,272,501 | 12/1993 | Nishi et al. | 356/401 |

FOREIGN PATENT DOCUMENTS 1-136002  5/1989  Japan .

*Primary Examiner*—Robert H. Kim
*Attorney, Agent, or Firm*—Armstrong, Westerman, Hattori, McLeland & Naughton

[57] ABSTRACT

A position detecting apparatus is used with an exposure apparatus for projecting a mask pattern onto a substrate. The position detecting apparatus detects a position of an alignment mark formed on the substrate by sending light through a film having a wavelength-selective feature. The position detecting apparatus includes a light sending system for emitting the position detecting light, a wavelength changing device for adjusting a wavelength band of the position detecting light directed onto the alignment mark, on the basis of the wavelength transmittance of the film having the wavelength-selective feature, and a light receiving system for detecting the light from the alignment mark. The position of the alignment mark can be determined on the basis of a photoelectric conversion signal outputted from the light receiving system.

21 Claims, 2 Drawing Sheets

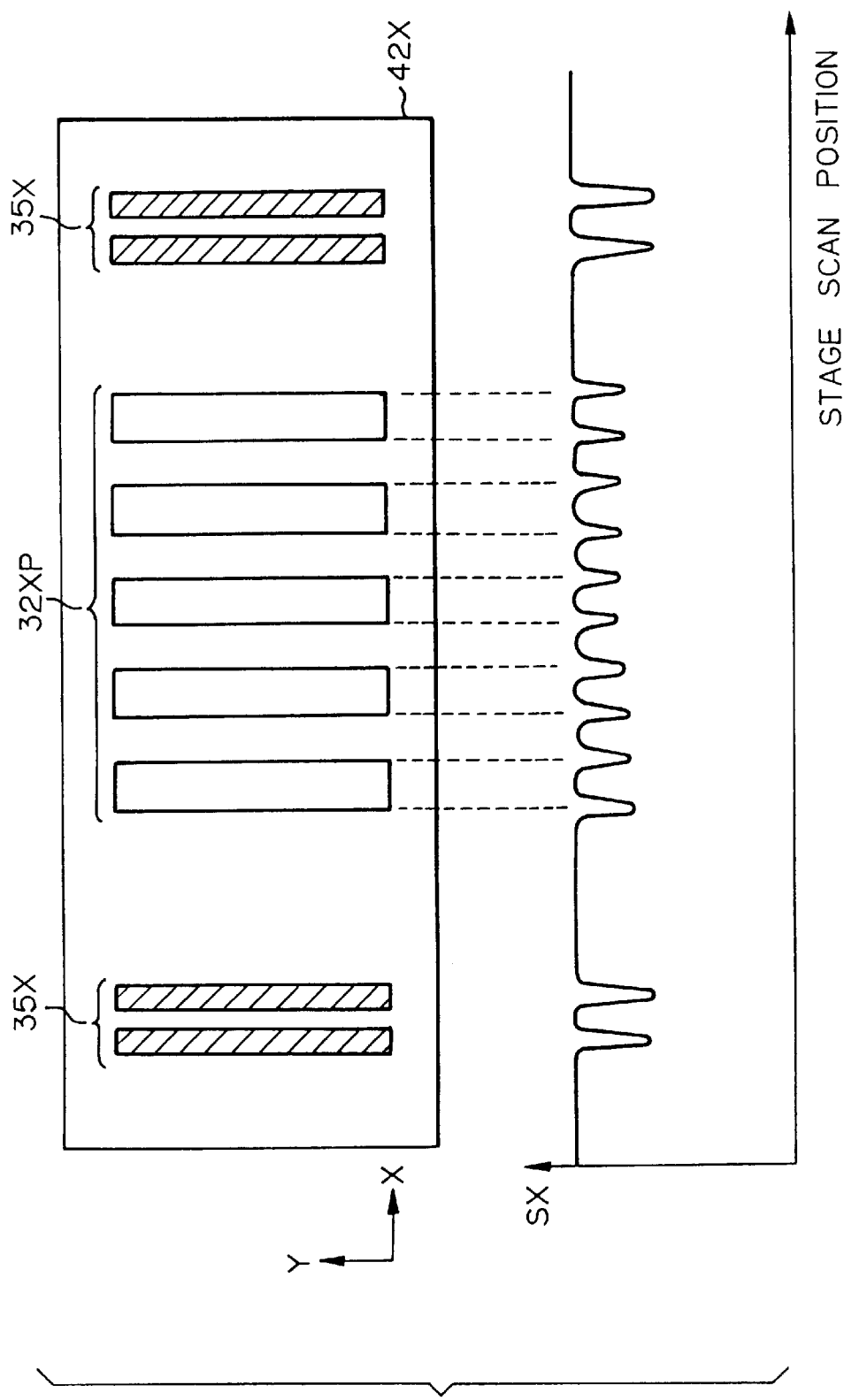

POSITION DETECTING APPARATUS

This application is a continuation of application Ser. No. 08/409,095, filed Mar. 23, 1995, now abandoned.

BACKGROUND OF THE INVENTION

1. Field of the Invention

The present invention relates to a position detecting apparatus, and more particularly, it relates to an alignment apparatus for photoelectrically detecting positions of alignment marks on a substrate such as a semiconductor element or a glass plate through photosensitive material such as photoresist in an exposure apparatus used in the manufacture of semiconductor elements or liquid crystal display elements through a lithographic technique.

2. Description of the Related Art

In exposure apparatuses such as steppers or step-and-scan projection exposure apparatuses, there is provided an alignment apparatus for performing alignment between a reticle (or a photomask and the like) on which a pattern to be transferred is formed and a wafer (or a glass plate and the like) on which photoresist is coated with high accuracy. In order to perform such alignment with high accuracy, it is necessary to correctly detect positions of wafer marks on the wafer.

In this regard, since roughness of a surface of the wafer is changed after an exposure operation and subsequent processes and since heights of the wafer marks in respective layers on the wafer often differ from a height of a background, it is difficult to correctly detect the positions of all of the wafer marks by using a single alignment system. Accordingly, in the past, the following alignment systems have been used for various purposes:

(1) Alignment system of LSA (Laser-Step-Alignment) type:

In this alignment system, a laser beam is directed onto a wafer mark, and light diffracted and scattered from the wafer mark is used to measure a position of such a wafer mark. This alignment system has been widely used regarding a wafer which is being processed.

(2) FIA (Field Image Alignment) system:

This alignment system is a sensor in which an enlarged image of a wafer mark obtained by directing light having a wide wavelength band (emitted from a light source such as a halogen lamp and the like) onto the wafer mark is picked up by an imaging element (such as a vidicon tube or a CCD), and an obtained image signal is image-treated to measure a position of the wafer mark. This system is particularly useful for the measurement of asymmetrical wafer marks on an aluminium layer or a wafer surface. This FIA system is disclosed in co-assigned patent application U.S. Ser. No. 841,833 filed on Feb. 26, 1992, for example.

(3) LIA (Laser Interferometric Alignment) system:

This alignment system is a sensor in which two laser beams having slightly different frequencies are directed onto a diffraction grating wafer mark from two directions, and two diffraction light beams generated are interfered with each other to generate interference light. From the phase of this light position information of the wafer mark is detected. This LIA system is effective for wafer marks having a small height difference or wafer marks having rough surfaces. The principle of detection in the LIA system is disclosed in U.S. Pat. No. 4,710,026 and co-assigned patent application U.S. Ser. No. 418,260 (filed on Oct. 6, 1989), for example.

In the past, these various alignment systems have been used properly in accordance with their purposes. Regarding wafers used in the exposure apparatuses, since a photoresist layer having a thickness of about 0.5–2 $\mu$m is normally formed on the entire surface of the wafer, if monochromatic light is used as alignment illumination light or laser beam, interference fringes are generated due to the monochromatic light, thereby causing a detection error when the position of the wafer mark is detected. In order to suppress the interference phenomenon, alignment illumination light of multi-wavelengths has been used or a band of the alignment illumination light has been widened.

For example, in the FIA systems of image pick-up type, a halogen lamp is used as an illumination light source. When a width of a wavelength band (except for a photosensitive band to the photoresist) of the illumination light is selected to be about 300 nm, the light reflected from the surface of the photoresist layer does not substantially interfere with the light reflected from the surface of the wafer, with the result being that a sharp image can be detected. Accordingly, in the FIA system, only by using white illumination light (having a wide band) and by adopting achromatism of a focusing optical system, the position of the wafer mark can be detected very accurately without being influenced by the photoresist layer.

In this regard, conventionally, since the photoresist layer is made of material having good permeability to light other than violet/ultraviolet light (exposure wavelength band), red/near-infrared light has been used mainly as the alignment illumination light so as not to sensitize the photoresist. Thus, for example, even when the width of the wavelength is selected to be 300 nm, a light band having a main wavelength of about 650 nm has been used, and a wavelength near the exposure wavelength has not been used to prevent the photoresist from being sensitized.

Also regarding the LIA systems, a technique has been proposed in which an influence of film interference of the photoresist layer is reduced by directing a plurality of pairs of laser beams having different wavelengths onto a diffraction grating wafer mark.

As mentioned above, in the conventional alignment systems, the influence of the interference of the photoresist layer is reduced by widening the bandwidth of the alignment illumination light or laser beam within the red/near-infrared wavelength range or by polychromatizing the illumination light.

However, recently, for example, when color liquid crystal panels or color CCDs are manufactured, in consideration of the fact that photoresist having low permeability to the red/near-infrared wavelength may be used, it has been required that a position of an alignment mark can be detected through a film having low permeability to the red/near-infrared wavelength.

That is to say, for example, in the manufacture of the color liquid crystal panels or color CCDs, red, green, blue or black photoresist (referred to as "color photoresist" hereinafter) materials are often used as the photoresist, and a color filter such as a red filter, a green filter or a blue filter is often used. In the case where such a color photoresist layer or color filter is used, when superimposing exposure is effected, the positions of the alignment marks provided under the color photoresist layer or color filter must be detected.

However, when the red/near-infrared light is used as the illumination light from the alignment system, since the red/near-infrared light is absorbed if the blue photoresist or blue filter is used, there arises a problem in which the position of the alignment mark cannot be detected. Accordingly, when the red/near-infrared light is used as the alignment light, as in the conventional case, depending on the colored thin films such as the color photoresist or the color filter to be used, the absorption of light occurs thereby making the detection of the wafer mark position impossible.

SUMMARY OF THE INVENTION

The present invention solves the above-mentioned conventional problems, and an object of the present invention is to provide a position detecting apparatus wherein, even when a film having a wavelength-selective nature, i.e., a photosensitive layer or a film having different permeability distribution features for respective wavelengths is coated on alignment marks on a substrate, positions of the alignment marks can be correctly detected.

It is another object of the invention to provide a projection apparatus wherein, even when a film (color film) having wavelength-selective nature covers alignment marks on a substrate, a mask and the substrate can be aligned with each other accurately for exposing a photoresist layer on the substrate to the image of the pattern of the mask.

It is further object of the invention to provide a micro-device wherein, even when a film (color film) having wavelength-selective nature covers alignment marks on a substrate, the alignment marks can be detected for producing the micro-device on the substrate.

According to the present invention, the following position detecting apparatus is provided. That is to say, there is provided a position detecting apparatus for detecting alignment marks formed on a substrate through a film having a wavelength-selective nature. The position detecting apparatus comprises a light sending system for directing position detecting light onto the alignment mark on the substrate through the film having the wavelength-selective nature, a wavelength changing member for adjusting a wavelength band of the position detecting light directed on the alignment mark in accordance with the wavelength permeability feature (spectral sensitivity) of the film having wavelength-selective nature, and a light receiving system for detecting the light from the alignment mark, where the position of the alignment mark is detected on the basis of a photoelectric conversion signal outputted from the light receiving system.

According to the above-mentioned position detecting apparatus, when a micro-device, such as a normal semiconductor element is manufactured, photoresist having high permeability to red/near-infrared is used as photosensitive material, and any film which may absorb the position detecting light is not used. The wavelength changing member sets the wavelength band of the light directed onto the alignment mark to be the normal red/near-infrared band. On the other hand, in the case where a micro-device, such as color liquid crystal display, color CCD and the like is manufactured, when photoresist (blue photoresist) having high permeability to blue light and low permeability to red light and therearound is used as photosensitive material, or when the position of the alignment mark must be detected through a blue filter, the wavelength changing member sets the wavelength band of the light directed onto the alignment mark to be in the proximity of a blue light band. By setting the wavelength band in this way, the position of the alignment mark can be detected correctly without sensitizing the photosensitive material by the position detecting light.

The present invention further provides the following position detecting apparatus. That is to say, there is provided a position detecting apparatus used with an exposure apparatus for projecting a mask pattern onto a substrate on which photosensitive material is coated and adapted to detect alignment marks formed on the substrate through a film having a wavelength-selective nature, and comprising a light sending system for directing light having a wide band passing through a plurality of films each having a wavelength-selective nature and used in the exposure apparatus onto the alignment mark on the substrate, a light receiving system for detecting the light from the alignment mark, and an adjusting device for changing the intensity of a photoelectric conversion signal outputted from the light receiving system, in accordance with a kind of the film having wavelength-selective nature on the substrate, and the position of the alignment mark is detected on the basis of the photoelectric conversion signal outputted from the light receiving system.

According to this position detecting apparatus, the exposure apparatus in which the position detecting apparatus is previously incorporated is used as a special use apparatus for substrates on which either one of two kinds of color photoresist (blue photoresist or green photoresist) is coated. The illumination light (emitted from the light sending system) having the wide band including a light with a wavelength permeable through these two color photoresist layers is directed onto the alignment mark on the substrate. In this case, since the light intensity of the reflected light is changed depending upon the kind of the color photoresist actually coated on the substrate, the intensity of the photoelectric conversion signal from the light receiving system is optimized by using the adjusting member. In this way, even when either one of these two color photoresist is provided on the alignment mark, the alignment mark can be correctly detected. Similarly, even when either one of more than 2 color filters of different colors is provided on the substrate, the alignment mark can be detected correctly through the color filter.

BRIEF DESCRIPTION OF THE DRAWINGS

FIG. 2 is a schematic illustration for explaining an imaging element, where a section (a) is a plan view of an image observed by an imaging element 39X of FIG. 1 and a section (b) is a chart of an image signal corresponding to the image shown in the section (a).

DETAILED DESCRIPTION OF THE PREFERRED EMBODIMENT

Figure 1:
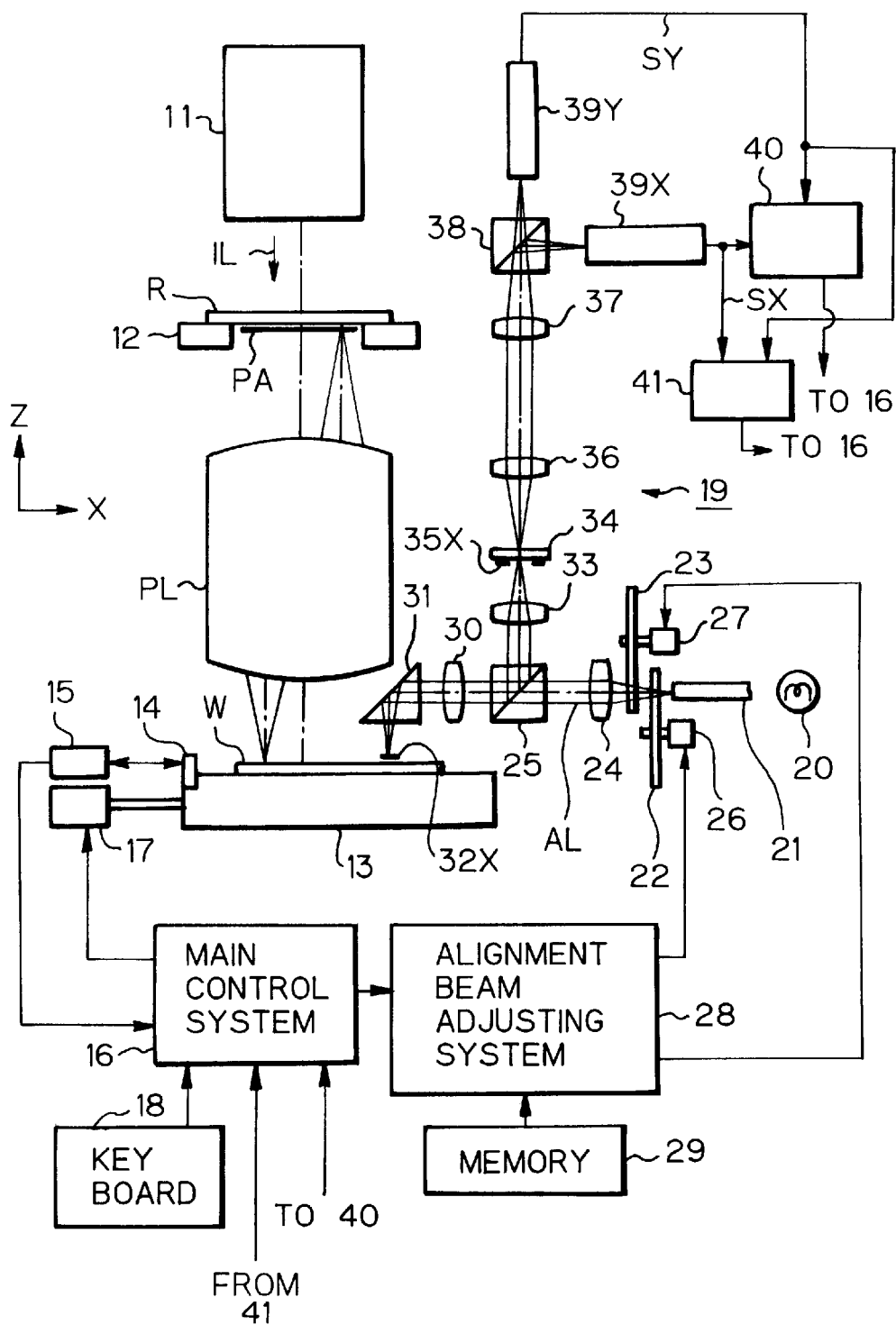
FIG. 1 is a schematic constructional view of a projection exposure apparatus in which a position detecting apparatus according to a preferred embodiment of the present invention is incorporated.

Now, a position detecting apparatus according to a preferred embodiment of the present invention will be explained with reference to the accompanying drawings.

FIG. 1 shows an example in which a projection exposure apparatus is used to manufacture a semiconductor element by utilizing a wafer as a substrate. Accordingly, in the explanation of the construction of the projection exposure apparatus which will be described hereinbelow, alignment marks provided on the substrate are referred to as "wafer marks". The projection exposure apparatus shown in FIG. 1 is also used to other micro-devices, such as liquid crystal display, CCD and thin film magnetic head using a glass plate as a substrate.

FIG. 1 shows the projection exposure apparatus according to the preferred embodiment. In FIG. 1, during exposure, exposure light IL (such as "i" radiation and excimer laser beam) emitted from an illumination optical system 11 is uniformly directed onto a pattern area PA of a reticle R secured to a reticle holder 12 so that a pattern in the pattern area PA is projected onto each of shot areas on a wafer W (or a glass plate) on which photoresist is coated, through a projection optical system PL. Prior to the exposure, it is necessary to correctly perform alignment between a center of the pattern area PA and a center of the shot area on the wafer W to be exposed.

The wafer W rests on a wafer stage 13. A Z axis is selected to be parallel with the optical axis of the projection optical system PL, and an X axis is selected to be parallel with a plane of FIG. 1 in a plane perpendicular to the Z axis and a Y axis is selected to be perpendicular to the plane of FIG. 1. The wafer stage 13 comprises a Z-stage for finely shifting the wafer W in the Z direction, a levelling stage for adjusting an inclination angle of the wafer W, and an XY-stage for positioning the wafer W in the X and Y directions. An L-shaped movable mirror 14 is secured to the wafer stage 13. An X-coordinate and a Y-coordinate of the wafer stage WS is always measured by using the movable mirror 14 and an external laser interferometer 15, and the measured coordinate values are sent to a main control system 16. The main control system 16 serves to control the coordinate values of the wafer stage 13 shifted by a drive system 17, on the basis of the coordinate values sent from the laser interferometer. A keyboard 18 through which an operator can input information such as a kind of photoresist, various commands and the like is connected to the main control system 16.

In order to detect a position of each of the shot areas on the wafer W, alignment wafer marks for the X axis and alignment wafer marks for the Y axis are provided in connection with each shot area. In FIG. 1, as an example, the wafer mark 32X for the X axis is illustrated. Prior to the exposure, the coordinate values (in a stage coordinate system) determined by the coordinate values of each wafer mark measured by the interferometer 15 are detected by an alignment system 19, and alignment regarding the corresponding shot area is performed on the basis of the detected coordinate values.

The wafer mark 32X according to the illustrated embodiment comprises rugged line-and-space patterns (multi pattern) spaced apart from each other in the X direction by a predetermined pitch (refer to FIG. 2), and the shape of a wafer mark for the Y axis corresponds to what is obtained if the wafer mark 32X is rotated by 90 degrees. These wafer marks are provided on scribe lines disposed on each shot area.

The alignment system serves to detect such wafer marks, and, in the illustrated embodiment, an FIA system, i.e., image processing type alignment system 19 of off-axis type is used. In FIG. 1, the illumination light from a halogen lamp 20 is directed to the alignment system 19 through an optical fiber 21. In this case, the illumination light emitted from one end of the optical fiber 21 enters a collimator lens system 24 through a wavelength selecting filter plate 22 and an ND filter plate 23. The wavelength selecting filter plate 22 is formed by a plurality of interference filters through which different wavelengths can pass and which are attached to a circular disc. By rotating the circular disc by a drive motor 26, a desired wavelength band in the illumination light emitted from the optical fiber 21 can be selected.

The ND filter plate 23 comprises an optical filter which is attached to a circular plate and has the transmittance which is continuously changed within a predetermined range. By rotating the circular disc by a drive motor 27, the intensity of the illumination light passing through the wavelength selecting filter plate 22 can be attenuated to a desired rate within the predetermined range. Rotational angles of the drive motors 26, 27 are adjusted by an alignment light adjusting system 28 to which the main control system 16 and a memory 29 are connected. Information regarding wavelength transmission features (spectral sensitivity) of a number of photoresist layers, and information regarding wavelength transmission features of color filters are stored in the memory 29.

The illumination light is changed by the collimator lens system 24, to parallel light beams AL which in turn pass through a half prism 25 and an objective lens 30 and are reflected by a prism mirror 31 to be directed onto the wafer mark 32X on the wafer W in a substantially vertical direction. The light reflected from the wafer mark 32X is returned to the half prism 25 through the prism mirror 31 and the objective lens 30, and light reflected by the half prism 25 enters an index plate 34 through a focusing lens 33, thereby focusing an image of the wafer mark 32X onto the index plate. That is to say, the index plate 34 is disposed substantially in an conjugate relation to the objective lens 30 and the focusing lens 33. Index marks 35X for X axis and index marks (not shown) for Y axis are formed on the index plate 34. As shown in the section (a) of FIG. 2 (referred to as "FIG. 2(a)" hereinafter), each index mark 35X for X axis includes two straight patterns extending in the Y direction, and the index marks are spaced apart form each other by a predetermined distance in the X direction. The image 32XP of the wafer mark 32X for the X axis is focused between the index marks 35X.

In FIG. 1, the light passing through the index plate 34 is directed to an imaging element (pick-up element) 39X for X axis and an imaging element 39Y for Y axis (which imaging elements each comprises a two-dimensional CCD element and the like) through a relay lens system 36, a relay lens system 37 and a half prism 38, so that the image of the index marks and the image of the wafer mark are focused on the X axis imaging element and the Y axis imaging element, respectively. Image signals SX, SY from the imaging elements 39X, 39Y are sent to an alignment control system 40. In the alignment control system 40, the position of the X axis wafer mark 32X is detected on the basis of the image signal SX from the imaging element 39X, and the position of the Y axis wafer mark is detected on the basis of the image signal SY from the imaging element 39Y. The results of the position detection are sent to the main control system 16.

Explaining the position detecting operation in detail, as shown in FIG. 2(a), an observation field 42X on the index plate 34 observed by the imaging element 39X is elongated in the X direction and includes the focused image 32XP of the wafer mark sandwiched by the index marks 35X. In this regard, an illumination field stop (not shown) is disposed at a position substantially in a conjugate relation to the wafer W in the collimator lens system 24 of FIG. 1 so that an illumination area on the wafer W, i.e., the observation field 42X of FIG. 2(a), is defined by the illumination field stop. In this case, scan lines in the imaging element 39X is set to be in the X direction, and, as shown in a section (b) of FIG. 2 (referred to as "FIG. 2(b)" hereinafter), the image signal SX outputted from the imaging element 39X corresponds to the index marks 35X and the image 32XP of the wafer mark. The image signal SX is made to have two values, for example, defined by appropriate threshold values so that a deviation amount of the wafer mark image 32XP with respect to the index marks 25X in the X direction is determined on the basis of two values of the signal. In the main control system 16, an X-coordinate position of the wafer mark 32X is detected or calculated by adding an X-coordinate value of the wafer stage 13 to the deviation amount. A Y-coordinate position of the wafer mark for the Y axis is detected in the similar manner.

In FIG. 2(b), automatic gain control (AGC) is applied to the image signal SX so that an average level of the signal is maintained at a predetermined constant level. In this case, the reason why the index marks 35X are used is that there is a danger of drifting of a scan start position of the imaging element 39X under various conditions.

In the illustrated embodiment, the image signals SX, SY outputted from the imaging elements 39X, 39Y are sent to a level detecting portion 41. In the level detecting portion 41, average values of the image signals SX, SY are independently detected, and the data regarding the average values is sent to the main control system 16. Since levels of the image signals SX, SY are controlled under the automatic gain control, if a light amount of the light reflected from the wafer mark exceeds a range which can be controlled under the automatic gain control, the average values detected by the level detecting portion 41 will be changed.

Next, the operation in the illustrated embodiment will be explained. As an example, it is assumed that a glass plate is used as the substrate and a three-color filter for a color crystal panel is manufactured by using photoresist (color photoresist) colored in blue (blue photoresist). The color of the photoresist may be red, green, blue or black. For example, when red photoresist is used, in FIG. 1, a liquid crystal substrate on which the red photoresist is coated is provided in place of the wafer W. In this case, the red photoresist is removed from the liquid crystal substrate at areas other than a predetermined window portion by using exposing and developing processes so that a red filter exists in the predetermined window portion only. Other color resist layers may be treated in the similar manner. Even when the color liquid crystal panel is manufactured in this way, alignment marks are formed in each of layers on the liquid crystal substrate. Thus, it is necessary to detect positions of the alignment marks through the color photoresist layer coated on the alignment marks.

In this case, information data regarding wavelength transmission for each of the red photoresist, green photoresist, blue photoresist and black photoresist are stored in the memory 29 of FIG. 1. More particularly, the average transmittance data regarding wavelength band sections obtained by dividing a visible wavelength band (having a wavelength of 400–750 nm) and a near-infrared wavelength band (having a wavelength of 750–1000 nm) by a unit of 10 nm, for example, are stored in the memory. Hereinbelow, the average wavelength transmittance distribution is referred to as "spectral sensitivity".

In this method, regarding the red photoresist, since red wavelength band can pass through the red photoresist layer as is in the normal photoresist layer, there is no problem. That is to say, when the operator inputs the fact that the red photoresist is now used to the main control system 16 via the keyboard 18, the main control system 16 sends a command to the alignment light adjusting system 28 so that the wavelength band and intensity of the illumination light AL must be adjusted to be commensurate with the red photoresist. In correspondence to this, in the alignment light adjusting system 28 of FIG. 1, the fact that the red wavelength band can be used is confirmed on the basis of the wavelength/transmission feature for the red photoresist stored in the memory 29, and then, the interference filter through which the red light can pass is aligned with the output end of the optical fiber 21 by rotating the wavelength selecting filter plate 22 by means of the motor 26.

Thereafter, the data regarding the average value of the image signal SX detected by the level detecting portion 41 is sent to the main control system 16. If the average value smaller than or greater than a predetermined rated value range, the main control system 16 emits the command to the alignment light adjusting system 28 to cause the latter to adjust the light amount of the illumination light AL. In response to this, in the alignment light adjusting system 28, the light amount of the illumination light passed through the wavelength selecting filter plate 22 is optimized by rotating the ND filter plate 23 by means of the drive motor 27. In this way, the position of the alignment mark (mark corresponding to the wafer mark 32X) can be detected with a high NS ratio and with high accuracy.

Thereafter, the alignment between the reticle and the substrate is achieved based on the detected position of the alignment mark so that the color photoresist on the substrate is exposed to the reticle pattern. By developing this substrate, a color photoresist image of a liquid crystal element is formed on the substrate.

In this case, in the alignment system 19, aberrations of various lens system (24, 30, 33, 36, 37) are corrected so that the aberrations become small in the wavelength band from blue to near infrared. Due to these corrections, even when the wavelength of the illumination light is changed or switched, the wafer mark image can be sharply focused onto the imaging elements 39X, 39Y. However, if the chromatic aberration of the focusing system including the objective lens 30 and the lens system 33 along its axis is still a problem, information regarding axial chromatic aberration for each wavelength can be previously stored in the memory 29 so that such chromatic aberration information is sent to the main control system 16. Then, the height of the substrate is adjusted by driving the Z stage of the wafer stage 13 by the control system 16 through the drive system 17 to cancel the axial chromatic aberration, thereby reducing the influence of the axial chromatic aberration.

In connection with the axial chromatic aberration, even when the objective lens 30 has a telecentric feature (toward the substrate) regarding a predetermined reference wavelength, the telecentric feature may be changed or destroyed for other wavelengths. If the telecentric feature is destroyed depending upon the wavelength in this way, a destroyed amount of the telecentric feature can be previously stored in the memory 29 for the central wavelength in each of wavelength bands. In this case, when the position of the substrate in the Z direction is changed by the Z stage to correct the axial chromatic aberration for the band employed, the measured position of the alignment mark is corrected by the main control system 16 by an amount corresponding to the destroyed amount of the telecentric feature for the central wavelength of the employed band. In this way, the position of the alignment mark can always be detected with high accuracy.

Regarding magnification chromatic aberration of the alignment system 19, when a distance (base line) between a reference point in the observation area of the alignment system 19 and the exposure center is determined, calibration regarding the magnification chromatic aberration may be effected. More specifically, for each color photoresist, the base line is measured in a condition that the illumination light having the wavelength corresponding to each color photoresist is directed onto a reference mark (not shown) on the wafer stage 13, and the measured results for respective color photoresist layers are stored in the memory. Alternatively, the magnification chromatic aberration may be previously measured and be stored as data.

When the green photoresist or the blue photoresist is used, since a noticeable amount of the red light (normal alignment illumination light) is absorbed by the photoresist, the wavelength band must be changed. More specifically, when the blue photoresist is used, the wavelength selecting filter plate 22 is rotated by the alignment light adjusting system 28 so that the interference filter through which the blue light can pass is aligned with the output end of the optical fiber 21. As a result, the illumination light AL is not absorbed by the blue photoresist, and, thus, an adequate amount of the light reflected from the alignment mark can reach the imaging element 39X. If a light amount of the blue illumination light is small, the transmission rate of the ND filter plate 23 may be increased. Similarly, when the green photoresist is used, green light may be used as the illumination light AL.

In this way, even when either one of the red photoresist, green photoresist and blue photoresist is used, the position of the alignment mark can be detected correctly. Further, since the light other than the light passing through the color photoresist is blocked, the color photoresist itself is not sensitized or excited by the alignment illumination light AL. In addition, since the wavelength bands capable of passing through the respective color photoresist layers are wide and each of the transmittable wavelength bands of the corresponding interference filters in the wavelength-selective filter plate 22 has a substantial width, the influence of the film interference of each color photoresist can be reduced.

When the black photoresist is used, since the transmittance of any light component in the visible light is low, the optimum wavelength having high transmittance cannot be selected. Thus, in this case, the wavelength selecting filter plate 22 is set so that the wavelength band of the illumination light AL is widened to increase the total light amount within a wavelength range which does not sensitize the black photoresist. Further, the light amount of the illumination light AL is increased by using the ND filter plate 23 so that the average value of the image signal detected by the level detecting portion 41 is maintained within a rated range. In dependence upon the kind of the black photoresist, when the near infrared wavelength band has a transmission area, the near infrared light may be selected by the wavelength selecting filter plate 22.

In the case where the black photoresist is used, when it is desired to significantly increase the light amount of the illumination light, for example, a stop may be previously disposed between the halogen lamp 20 and the optical fiber 21. In this case, during the normal operation, an opening rate of the stop is decreased to reduce the light amount of the illumination light.

Although the spectral sensitivity regarding the transmittance of each of color photoresist layers is stored in the memory 29 in the projection exposure apparatus of FIG. 1 so that all of the color photoresist layers can be treated, respective projection exposure apparatuses may be designed so that each of the projection exposure apparatuses can expose only one color photoresist (or color filter), as well as the normal photoresist, and the interference filter corresponding to the relevant color photoresist alone may be mounted on the wavelength selecting filter plate 22 of each projection exposure apparatus. By adopting this technique, the arrangement can be simplified. In this case, the exposure regarding one color photoresist is performed by using one of the projection exposure apparatuses, and the exposure regarding another color photoresist is performed by using another projection exposure apparatus.

Alternatively, a first projection exposure apparatus may be designed to treat the blue photoresist and the green photoresist, for example, and a second projection exposure apparatus may be designed to treat the red photoresist and the black photoresist so that a different pair of color photoresist layers can be treated by each of two projection exposure apparatuses. As a first alteration, a first projection exposure apparatus may be designed to treat the blue photoresist, green photoresist and red photoresist, for example, and a second projection exposure apparatus may be designed to treat the black photoresist, as well as the normal photoresist. As a second alteration, a first projection exposure apparatus may be designed to treat the blue photoresist alone, for example, and a second projection exposure apparatus may be designed to treat the green photoresist, red photoresist and black photoresist.

In the above-mentioned embodiment, while an example that the wavelength selecting filter plate 22 is set in accordance with the kind of the color photoresist inputted by the operator is explained, the optimum interference filter in the wavelength selecting filter plate 22 may be automatically selected in the following manner. That is to say, in order to automatically select the optimum interference filter, for example, when a position of a first alignment mark on a first substrate among a lot of substrates is detected, the wavelength band of the illumination light AL is gradually changed by rotating the wavelength selecting filter plate 22 in a condition that the transmittance of the ND filter plate 2 is selected to be an intermediate value (about 50%). Then, the average value of the image signals detected by the level detecting portion 41 is monitored so that the light having the wavelength band selected when the average value becomes maximum is determined as light to be used, and the wavelength selecting filter plate 22 is fixed at that position. Then, the ND filter plate 22 is rotated to properly set the average levels of the image signals SX, SY.

Thereafter, under this condition so set, the positions of the remaining alignment marks on the current substrate are detected, and then, the positions of the alignment marks on the remaining substrates are detected. In this technique, the positions of the alignment marks can accurately be detected with high SN ratio.

In place of the fact that the kinds of the color photoresist and of the color filter are inputted by the operator to the main control system 16 through the keyboard 18, an identifying code (for example, bar code) representative of information regarding the spectral sensitivity of the transmittance of a film having wavelength-selective feature coated on a substrate such as a wafer, a liquid crystal substrate or the like may be formed on the substrate or on a cassette containing such a substrate. In this case, the identifying code on the substrate or the cassette can be read by a bar code reader (not shown) and the read spectral sensitivity of the transmittance can be automatically supplied to the alignment light adjusting system 28. Alternatively, a "name" of a substrate alone may be registered in a corresponding identifying code and the transmittance of a film having wavelength-selective feature coated on such a substrate may be stored in the memory 29 of the alignment light adjusting system 28 in correspondence to the "name" of the substrate.

In FIG. 1, while an example that the wavelength of the illumination light is changed by rotating the wavelength selecting filter plate 22 in accordance with the transmittance of the film (such as color photoresist) having wavelength-selective feature is explained, in place of this example, for example, light having a wide wavelength band (including multi wavelength light) including wavelengths capable of passing through two or more kinds of color photoresist layers may always be directed onto the substrate. In this case, in accordance with the kind of the color photoresist (i.e. in accordance with the wavelength passing through the photoresist), the average intensity of each of the image signals SX, SY from the imaging elements 39X, 39Y is set to be within a predetermined limit level range.

In order to adjust the intensity of each of the image signals SX, SY, a method for electrically changing amplitude of the signals under the action of the automatic gain control (AGC), a method for changing a light emitting power of a light source for the light having a wide wavelength band (including multi wavelength light) directed on the substrate, or a method for changing intensity of light incident to each imaging element 39X, 39Y by using the ND filter plate 22 of FIG. 1 can be used. For example, in an exposure apparatus which can treat the blue photoresist and the green photoresist, light having a wide wavelength band (including multi wavelength light) including a blue color and a green color is directed on the substrate. In this case, if the signal intensity of the green photoresist is considerably weaker than that of the blue photoresist, when the exposure apparatus is desired to be used to treat the green photoresist, the intensity of the light having the wide wavelength directed onto the substrate may be increased. With this arrangement, for example, the wave-length varying member including the wavelength selecting filter plate 22 shown in FIG. 1 can be omitted, thereby simplifying the entire apparatus.

In FIG. 1, while the ND filter plate 23 acting as the light intensity changing member is disposed within the light sending system (the light path from the halogen lamp 20 for illuminating the mark on the substrate), such an ND filter plate 23 may be disposed between the relay lens system 37 and the half prism 38 in the light receiving path from the mark on the substrate to the imaging elements 39X, 39Y to change the intensity of the light incident to each imaging element 39X, 39Y. Furthermore, the light intensity changing member is not limited to the ND filter plate 23 shown in FIG. 1. The same function may be achieved by any other suitable means, such as a stop having a variable aperture and an acousto-optic modulator utilizing the Raman-Nath diffraction (Debye-Sears effect).

While the operation regarding the illustrated embodiment is explained in connection with the manufacture of the color liquid crystal panel as an example, the present invention can be similarly applied to the manufacture of a color CCD, for example. Furthermore, although the illustrated embodiment is described assuming that a color photoresist should be used, the foregoing embodiment can also be applied as it is to the case where a color filter is interposed between a photoresist and a substrate to attain the same effect.

In the illustrated embodiment, while an example that the halogen lamp is used as the light source for the alignment light is explained, an LED or a laser diode may be used as the light source. Further, the intensity of the illumination light may be adjusted by changing the electric power supplied to such a light source.

In this regard, in the illustrated embodiment, while an example that the wavelength band of the alignment illumination light is widened by using the halogen lamp is explained, the illumination light may have multi wavelengths. In this case, it is desirable that each of the wavelengths of the illumination light has a predetermined width (for example, about ±10–±50 nm). Alternatively, the light source for the alignment light may be constituted by a plurality of light sources having output wavelengths which differ from each other at least partially so that the light having the wide wavelength band or the light having the multi wavelengths can be derived from these light sources.

In the illustrated embodiment, while the present invention is applied to the FIA system of off-axis type, the present invention may similarly be applied to an LIA system or an alignment system of LSA type. Of course, the present invention can be applied to an alignment system of TTL (through-the-lens) type or an alignment system of TTR (through-the-reticle) type. However, in the TTL alignment system or the TTR alignment system, since the chromatic aberration of the projection optical system PL may cause a problem, an aberration correcting plate (i.e. a transparent plate having a plurality of diffraction gratings corresponding to the wavelength widths of the illumination light for alignment) may be disposed in the proximity of a pupil plane (Fourier transform plane for the reticle R) of the projection optical system PL as shown in U.S. Pat. No. 5,204,535 so that the diffraction grating can be switched or changed in accordance with the used illumination light to bring the axial chromatic aberration and the magnification chromatic aberration of the illumination light to zero or below a predetermined limit value by using the optimum diffraction grating. In this case, for example, in order to treat three kinds of color photoresist layers, three sets of diffraction gratings for the respective colors are formed on the transparent plate.

As mentioned above, the present invention is not limited to the above-mentioned embodiment, but, various alterations and modifications can be adopted within the scope of the present invention.

In the position detecting apparatus according to one aspect of the present invention, even when the photosensitive layer or film having the transmittance distribution for each wavelength different from that of the previously used film is coated on the alignment wafer mark, the wavelength band of the position detecting illumination light can be set to be the wavelength band which cannot be absorbed by the film having the wavelength- selective feature. Accordingly, since the adequate amount of the light reflected from the alignment mark is directed to the light receiving system, the position of the alignment mark can be correctly detected without exposing the photosensitive material.

Further, by providing the memory in which the wavelength transmittance values of the plural films having the wavelength-selective features are stored, and the input device for inputting the kind of the film having the wavelength-selective feature coated on the substrate, when the wavelength band of the alignment light is adjusted by the wavelength changing member on the basis of the stored wavelength transmittance corresponding to the kind of the film inputted by the input device, the wavelength band of the alignment light can be correctly set manually.

On the other hand, by providing the light intensity detector for detecting the intensity of each photoelectric conversion signal outputted from the light receiving system, and the control means for determining the wavelength band of the alignment light suitable to the film having the wavelength-selective feature on the basis of the intensity detected by the light intensity detector when the wavelength band of the light directed on the alignment mark is changed by the wavelength changing member, the alignment light having the optimum wavelength band can be selected automatically.

When the intensity of the alignment light directed on the alignment mark is adjusted by the wavelength changing member in accordance with the wavelength transmittance of the film having the wavelength-selective feature, the NS ratio of the light received by the light receiving system can always be maintained to the high level.

In the position detecting apparatus according to another aspect of the present invention, since the light beams having wide wavelength bands passing through a plurality of films (possible to be put on the substrate) having wavelength-selective features are directed onto the substrate and the intensity of each of the obtained photoelectric conversion signals is adjusted, even when the photosensitive layers or films having different wavelength transmission distributions are coated on the alignment mark, the position of the alignment mark can be detected correctly.

In addition, when the intensity of light is changed by using the light intensity changing member in accordance with the transmittance of the film having the wavelength-selective feature, even if the transmittance of the film having the wavelength-selective feature is greatly changed, the position of the alignment mark can be detected easily and correctly.

What is claimed is:

1. A position detecting apparatus for detecting an alignment mark formed on a substrate which is covered with a film having a wavelength selective feature, comprising:

an alignment optical system which detects said alignment mark on the substrate by directing position detecting light through said film having the wavelength-selective feature;

a wavelength changing device which is disposed in a path of said position detecting light and adjusts a wavelength of the position detecting light in accordance with the wavelength-selective feature of said film;

a correction device which corrects an optical error of said alignment optical system which is created when the wavelength of said position detecting light is set in accordance with said film having the wavelength-selective feature, and a control system, connected to said wavelength changing device and said correction device, which controls said correction device based on the wavelength of said position detecting light set by said wavelength changing device, wherein said alignment mark is detected by said alignment optical system of which said optical error has been corrected.

2. A position detecting apparatus according to claim 1, further comprising a memory connected to said wavelength changing device and storing at least wavelength-transmission features for different wavelengths for each of a plurality of films having wavelength-selective features.

3. A position detecting apparatus according to claim 2, wherein said memory also stores information regarding said optical error of said alignment optical system.

4. A position detecting apparatus according to claim 1, wherein said alignment optical system includes a light sending system for directing said position detecting light onto the alignment mark and a light receiving system for detecting the light from said alignment mark, said position detecting apparatus further comprising an image processor for determining the position of the alignment mark through an image processing of photoelectric conversion signals outputted from said light receiving system.

5. A position detecting apparatus according to claim 1, further comprising a light intensity adjusting device for adjusting the intensity of said position detecting light directed to the alignment mark.

6. A position detecting apparatus according to claim 2, wherein said wavelength changing device includes a wavelength selecting portion formed by a plurality of circumferentially-spaced interference filters through which beams of different wavelengths can pass, respectively, and wherein the wavelength changing device selects one of said interference filters in accordance with the data of the wavelength transmission feature read out from said memory.

7. A position detecting apparatus according to claim 1, wherein the material of said film having the wavelength-selective feature comprises a color resist.

8. A position detecting apparatus according to claim 1, wherein the position detecting apparatus is adapted to be used in an exposure apparatus for directing an image of a pattern of a mask onto said substrate through a projection optical system.

9. A position detecting apparatus according to claim 8, wherein said alignment optical system detects the alignment mark without having said position detecting light pass through said projection optical system.

10. A position detecting apparatus according to claim 8, wherein said substrate is supported on a stage which is movable in the direction of the optical axis of said projection optical system and said correction device actuates said stage to eliminate, among various optical errors of said alignment optical system, a longitudinal chromatic aberration.

11. A position detecting apparatus according to claim 3, wherein said optical error of the alignment optical system stored in said memory is a chromatic aberration of magnification.

12. A method of detecting an alignment mark formed on a substrate which is covered with a film having a wavelength-selective feature by directing position detecting light to said alignment mark through said film by an alignment optical system, comprising the steps of:

receiving the position detecting light returned from said alignment mark by a light receiving system while changing the wavelength of said position detecting light emanated through said alignment optical system;

determining the wavelength of the position detecting light when the light received by said light receiving system has the highest intensity;

correcting an optical error of said alignment optical system which is created when the wavelength of said position detecting light is set in accordance with said film having the wavelength-selective feature; and continuing the alignment mark detection operation by receiving the position detecting light of the determined wavelength with said light receiving system.

13. A method according to claim 12, further comprising a step of adjusting, after said wavelength is determined, the intensity of the position detecting light having the thus determined wavelength.

14. A method according to claim 13, wherein the material of said film comprises a color resist.

15. A method for making an exposure apparatus which forms a pattern on a substrate by an exposure optical system, the substrate is formed with an alignment mark and is covered with a film having a wavelength-selective feature, comprising the steps of:

providing an alignment optical system which directs position detecting light to said alignment mark through said film without having the position detecting light pass through said exposure optical system; and providing a wavelength changing device which is disposed in a path of the position detecting light and adjusts a wavelength of the position detecting light in accordance with the wave-length-selective feature of said film;

providing a correction device which corrects an optical error of said alignment optical system which is created when the wavelength of said position detecting light is set in accordance with film having the wavelength selective feature; and providing a control system connected to said wavelength changing device and said correction device, the control system controls said correction device based on the wavelength of said position detecting light set by said wavelength changing device.

16. A method according to claim 15, further comprising the step of providing a projection optical system between the mask and the substrate.

17. A method according to claim 16, wherein said position detecting light irradiates said alignment mark without passing through said projection optical system.

18. A method according to claim 15, further comprising the step of providing a correction device for correcting an optical error of said alignment optical system which is created when the wavelength of said position detecting light is set in accordance with said film having the wavelength-selective feature.

19. A method according to claim 15, wherein said wavelength changing device includes a plurality of interference filters through which beams of different wavelengths can pass, respectively.

20. A method for making a substrate on which a pattern has been formed by utilizing an exposure apparatus, wherein said substrate is formed with an alignment mark in an exposure process and is covered with a film having a wavelength-selective feature, said exposure apparatus manufactured by the steps of:

providing an alignment optical system which directs position detecting light to said alignment mark through said film without having the position detecting light pass through said exposure optical system;

providing a wavelength changing device which is disposed in a path of the position detecting light and adjusts a wavelength of the position detecting light in accordance with the wavelength-selective feature of said film;

providing a correction device which corrects an optical error of said alignment optical system which is created when the wavelength of said position detecting light is set in accordance with film having the wavelength-selective feature; and providing a control system connected to said wavelength changing device and said correction device, the control system controls said correction device based on the wavelength of said position detecting light set by said wavelength changing device.

21. A position detecting apparatus according to claim 2, wherein said correction device moves said substrate to correct said optical error.

* * * * *